United States Patent
Banba

(10) Patent No.: US 8,309,280 B2
(45) Date of Patent: Nov. 13, 2012

(54) POSITIVE-TYPE PHOTOSENSITIVE RESIN COMPOSITION, CURED FILM, PROTECTIVE FILM, INSULATING FILM, AND SEMICONDUCTOR DEVICE

(75) Inventor: Toshio Banba, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 197 days.

(21) Appl. No.: 12/669,565

(22) PCT Filed: Aug. 8, 2008

(86) PCT No.: PCT/JP2008/064614
§ 371 (c)(1),
(2), (4) Date: Jun. 10, 2010

(87) PCT Pub. No.: WO2009/022732
PCT Pub. Date: Feb. 19, 2009

(65) Prior Publication Data
US 2010/0239977 A1     Sep. 23, 2010

(30) Foreign Application Priority Data
Aug. 10, 2007 (JP) ................. 2007-208703

(51) Int. Cl.
*G03F 7/023* (2006.01)
(52) U.S. Cl. .......... 430/18; 430/165; 430/166; 430/191; 430/192; 430/193
(58) Field of Classification Search ............... 430/18, 430/191, 192, 193, 165, 166
See application file for complete search history.

(56) References Cited

U.S. PATENT DOCUMENTS 7,781,131 B2 * 8/2010 Makabe .............. 430/18
2004/0023147 A1 * 2/2004 Hirano et al. .......... 430/191

FOREIGN PATENT DOCUMENTS

| JP | 07-199464 | 8/1995 |
| JP | 11-258808 | 9/1999 |
| JP | 2005-250462 | 9/2005 |
| JP | 2007-079264 | 3/2007 |
| JP | 2007-171945 | 7/2007 |

OTHER PUBLICATIONS

Extended European Search Report for corresponding EP Application No. 08792491.6-2222, Oct. 8, 2010.

* cited by examiner

*Primary Examiner* — John Chu
(74) *Attorney, Agent, or Firm* — Ditthavong Mori & Steiner, P.C.

(57) ABSTRACT

A positive-type photosensitive resin composition includes (A) a polyamide resin that includes a structural unit shown by the following formula (1) and a structural unit shown by the following formula (2), and (B) a photosensitive compound, the polyamide resin (A) having a weight average molecular weight (Mw) of 5000 to 80,000, and a cured film obtained by curing the positive-type photosensitive resin composition at 250° C. having a tensile modulus of elasticity of 2.0 to 4.0 GPa and a tensile elongation of 10 to 100%.

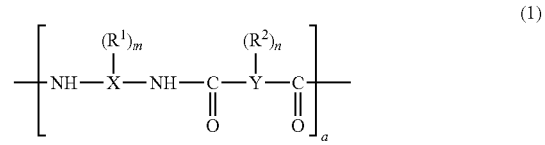

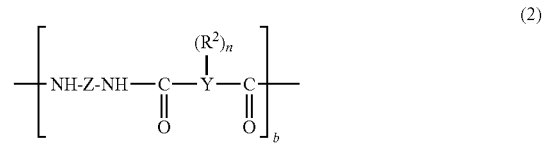

According to the present invention, a positive-type photosensitive resin composition that can be cured at a low temperature and a highly reliable semiconductor device including a cured film of the positive-type photosensitive resin composition can be provided.

9 Claims, 4 Drawing Sheets

Fig.4
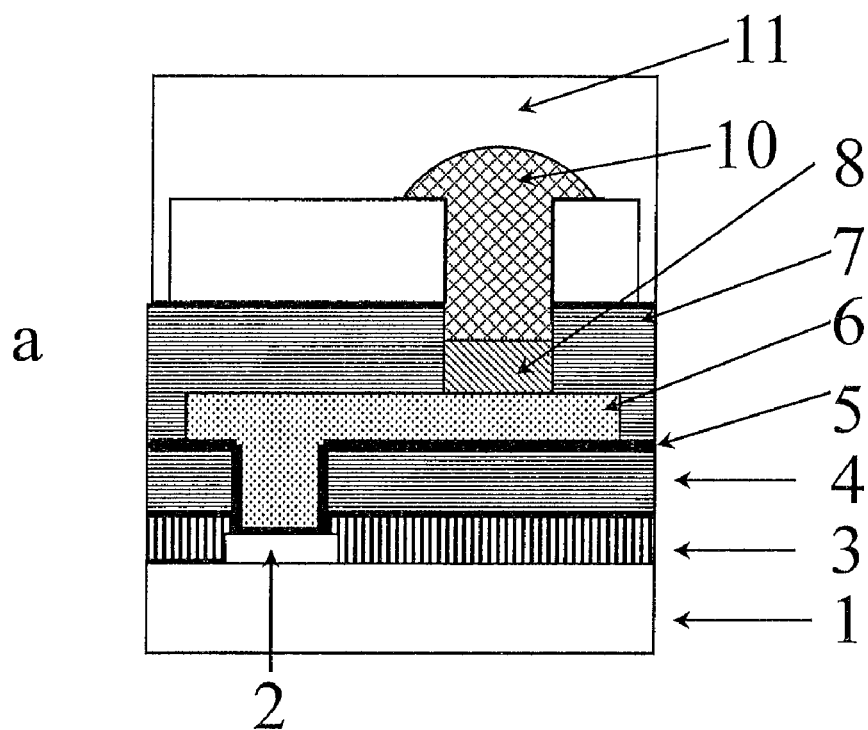
a
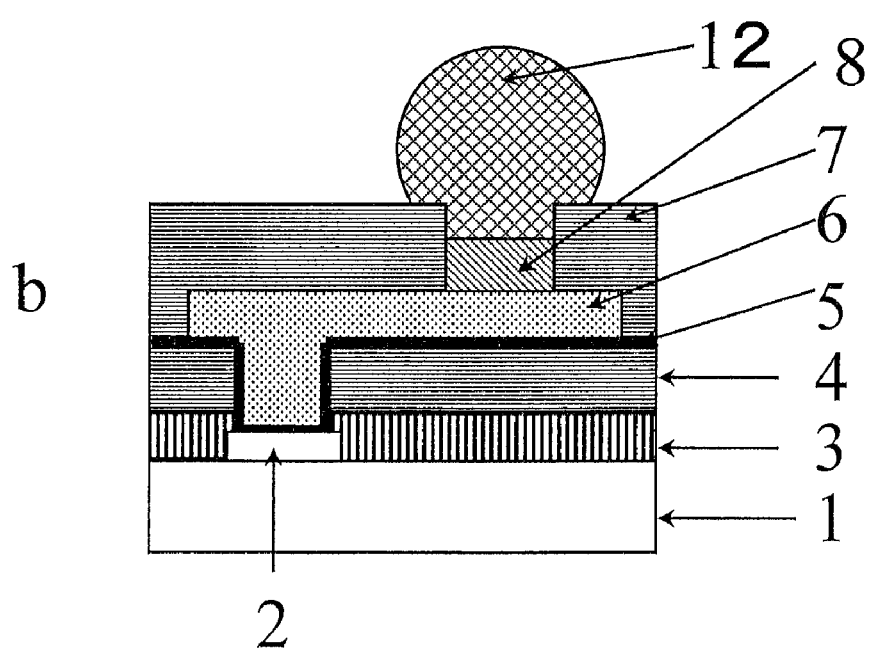
b

POSITIVE-TYPE PHOTOSENSITIVE RESIN COMPOSITION, CURED FILM, PROTECTIVE FILM, INSULATING FILM, AND SEMICONDUCTOR DEVICE

TECHNICAL FIELD

The present invention relates to a positive-type photosensitive resin composition, a cured film obtained by curing the composition, a protective film and an insulating film formed using the cured film, and a semiconductor device using the same.

BACKGROUND ART

As a positive-type photosensitive resin composition, a resin composition that contains a phenol novolac resin, a cresol novolac resin, or a vinylphenol novolac resin (i.e., an alkali-soluble resin that exhibits high sensitivity and high resolution and does not reduce the film thickness to only a small extent), a photoacid generator, and a crosslinking agent has been used (refer to Patent Documents 1 and 2).

In recent years, the wires of a semiconductor element for which the positive-type photosensitive resin composition is used has been reduced in size. Therefore, if the positive-type photosensitive resin composition is cured at a high temperature, the wires of the semiconductor element may be damaged due to heat. The positive-type photosensitive resin composition has been extensively studied to form an insulating film or a protective film of a wafer-level package (WLP). In this case, a deterioration of a transistor may occur if the positive-type photosensitive resin composition is cured at a high temperature.

When the positive-type photosensitive resin composition is used to form an insulating film or a protective film of a semiconductor element, if the cured positive-type photosensitive resin composition has a low glass transition temperature (Tg) and a low modulus of elasticity, cracks may occur in the insulating film or the protective film due to a filler (silica) contained in an encapsulation resin that encapsulates the semiconductor element.

The novolac resin-based positive-type photosensitive resin composition and the norbornene-based positive-type photosensitive resin composition disclosed in Patent Documents 1 and 2 can be cured at a low temperature, but produce a cured film having poor properties (i.e., low glass transition temperature (Tg) and low modulus of elasticity). Therefore, these positive-type photosensitive resin compositions may not be used to form an insulating film or a protective film of a semiconductor element.

Patent Document 1: JP-A-7-199464
Patent Document 2: JP-A-11-258808

In view of the above situation, an object of the present invention is to provide a positive-type photosensitive resin composition that can be cured at a low temperature, and a highly reliable semiconductor device including a cured film of the positive-type photosensitive resin composition.

DISCLOSURE OF THE INVENTION

According to the present invention, the above object can be achieved by the following (1) to (9).
(1) A positive-type photosensitive resin composition comprising (A) a polyamide resin that includes a structural unit shown by the following formula (1) and a structural unit shown by the following formula (2), and (B) a photosensitive compound, the polyamide resin (A) having a weight average molecular weight (Mw) of 5000 to 80,000, and a cured film obtained by curing the positive-type photosensitive resin composition at 250° C. having a tensile modulus of elasticity of 2.0 to 4.0 GPa and a tensile elongation of 10 to 100%,

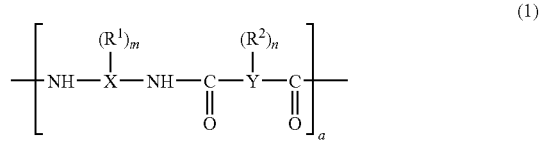

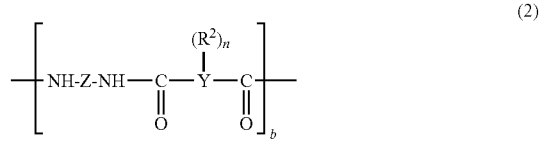

wherein X and Y represent organic groups, $R^1$ represents a hydroxyl group, —O—$R^3$, or an organic group having 1 to 5 carbon atoms ($R^1$ may be the same or different when m is two or more), $R^2$ represents a hydroxyl group, a carboxyl group, —O—$R^3$, or —COO—$R^3$ ($R^2$ may be the same or different when n is two or more), $R^3$ represents an organic group having 1 to 15 carbon atoms, provided that at least one $R^2$ is a carboxyl group when $R^1$ is not a hydroxyl group, and at least one $R^1$ is a hydroxyl group when $R^2$ is not a carboxyl group, m represents an integer from 0 to 4, n represents an integer from 0 to 4, Z represents —$R^4$—Si($R^6$)($R^7$)—O—Si($R^6$)($R^7$)—$R^5$— (wherein $R^4$ to $R^7$ represent organic groups), a represents an integer equal to or larger than one, and b represents an integer equal to or larger than zero, provided that [a/(a+b)]×100=30 to 100.
(2) The positive-type photosensitive resin composition according to (1), wherein a cyclization rate ratio ([A]/[B]) of the cyclization rate ([A]%) of a cured film obtained by curing the positive-type photosensitive resin composition at 250° C. to the cyclization rate ([B]%) of a cured film obtained by curing the positive-type photosensitive resin composition at 300° C. is 0.30 or more, and a cured film obtained by curing the positive-type photosensitive resin composition at 250° C. has a glass transition temperature (Tg) of 230 to 400° C.
(3) The positive-type photosensitive resin composition according to (1) or (2), wherein the photosensitive compound (b) is a diazoquinone compound.
(4) The positive-type photosensitive resin composition according to any one of (1) to (3), the positive-type photosensitive resin composition being used to form an insulating film or a protective film of a semiconductor device.
(5) The positive-type photosensitive resin composition according to any one of (1) to (4), wherein a thickness change rate shown by the following expression (1) is within ±1%.

Thickness change rate (%)=[(thickness after immersion/thickness before immersion)×100]−100  (1)

when immersing a cured film obtained by curing the positive-type photosensitive resin composition at 250° C. in a flux cleaning agent at 50° C. for 10 minutes.
(6) A cured film obtained by curing the positive-type photosensitive resin composition according to any one of (1) to (5).
(7) A protective film comprising the cured film according to (6).
(8) An insulating film comprising the cured film according to (6).
(9) A semiconductor device comprising the cured film according to (6).

According to the present invention, a positive-type photosensitive resin composition that can be cured at a low temperature and a highly reliable semiconductor device including a cured film of the positive-type photosensitive resin composition can be provided.

BRIEF DESCRIPTION OF THE DRAWINGS

FIG. 4 is a schematic view (3) showing a WLP semiconductor device production process.

BEST MODE FOR CARRYING OUT THE INVENTION

Figure 1:
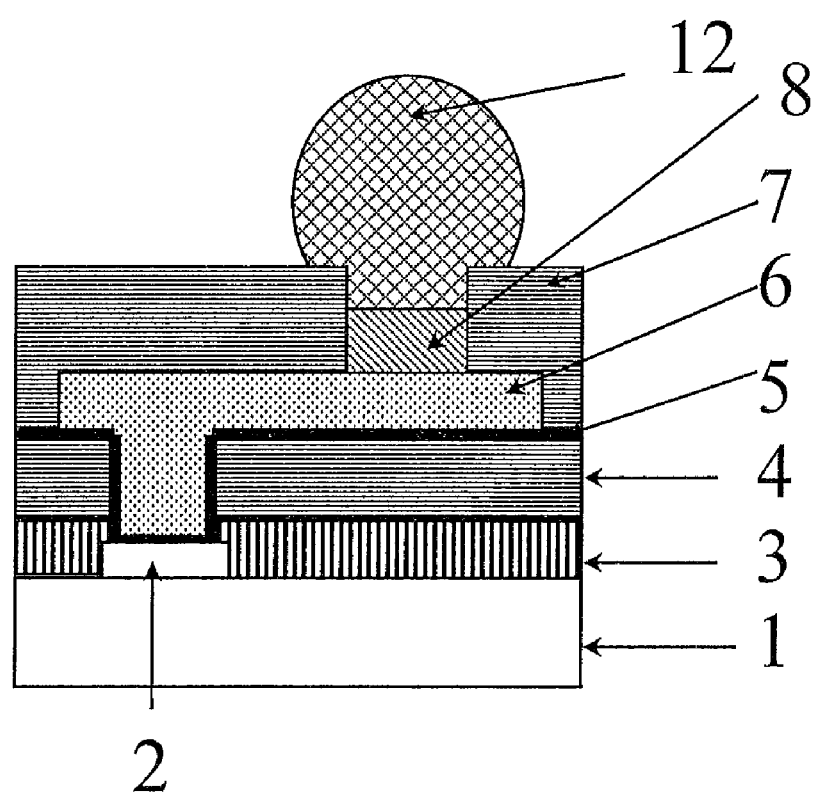
FIG. 1 is a cross-sectional view showing a pad area of a semiconductor device according to one embodiment of the invention.

The positive-type photosensitive resin composition and the semiconductor device according to the present invention are described below.

The positive-type photosensitive resin composition according to the present invention includes (A) a polyamide resin that includes a structural unit shown by the following formula (1) and a structural unit shown by the following formula (2), and (B) a photosensitive compound, the polyamide resin (A) having a weight average molecular weight (Mw) of 5,000 to 80,000, and a cured film obtained by curing the positive-type photosensitive resin composition at 250° C. having a tensile modulus of elasticity of 2.0 to 4.0 GPa and a tensile elongation of 10 to 100%.

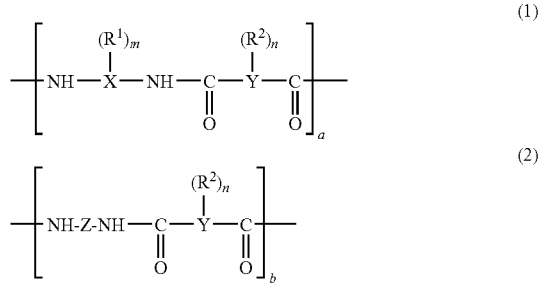

When using the cured film obtained by curing the positive-type photosensitive resin composition according to the present invention at 250° C. and having a modulus of elasticity of 2.0 to 4.0 GPa as an insulating film or a protective film of a semiconductor element, a situation in which cracks occur in the insulating film or the protective film due to a filler (silica) contained in an encapsulation resin that encapsulates the semiconductor element can be prevented. Moreover, occurrence of cracks or delamination during a temperature cycle test can be prevented. Since the cured film obtained by curing the positive-type photosensitive resin composition at 250° C. has a tensile elongation of 10 to 100%, a situation in which cracks occur in the insulating film or the protective film can be prevented. Moreover, sufficient adhesion can be achieved during a high-temperature process employed for a semiconductor device.

The polyamide resin (A) included in the positive-type photosensitive resin composition according to the present invention includes the structural unit shown by the formula (1) and the structural unit shown by the formula (2), wherein the structural unit shown by the formula (1) and the structural unit shown by the formula (2) are randomly bonded via an amide bond to form a resin. The polyamide resin (A) has an oxazole structure, an oxazole precursor structure, an imide structure, an imide precursor structure, or an amic acid ester structure. Note that the polyamide resin (A) includes a polyamide resin in which part of an oxazole precursor structure or an imide precursor structure in a polyamide resin that includes the structural unit shown by the formula (1) and the structural unit shown by the formula (2) is closed to form an oxazole structure or an imide structure.

The polyamide resin (A) is obtained by reacting a diamine compound selected from a diamine, bis(aminophenol), and 2,4-diaminophenol containing X with an acid compound selected from a tetracarboxylic anhydride, trimellitic anhydride, dicarboxylic acid, dicarboxylic acid dichloride, dicarboxylic acid derivative, hydroxydicarboxylic acid, and hydroxydicarboxylic acid derivative containing Y, for example. Alternatively, the polyamide resin (A) is obtained by reacting a diamine compound selected from a diamine, bis(aminophenol), and 2,4-diaminophenol containing X, a silicon diamine compound containing Z, and an acid compound selected from a tetracarboxylic anhydride, trimellitic anhydride, dicarboxylic acid, dicarboxylic acid dichloride, dicarboxylic acid derivative, hydroxydicarboxylic acid, and hydroxydicarboxylic acid derivative containing Y, for example. When the acid compound is a dicarboxylic acid, an active ester-type dicarboxylic acid derivative that has been reacted with 1-hydroxy-1,2,3-benzotriazole or the like may be used to increase the reaction yield and the like.

In the formula (1), X represents an organic group, and preferably an aromatic group. Examples of the organic group represented by X include organic groups shown by the following formula (3). These organic groups may be used either individually or in combination.

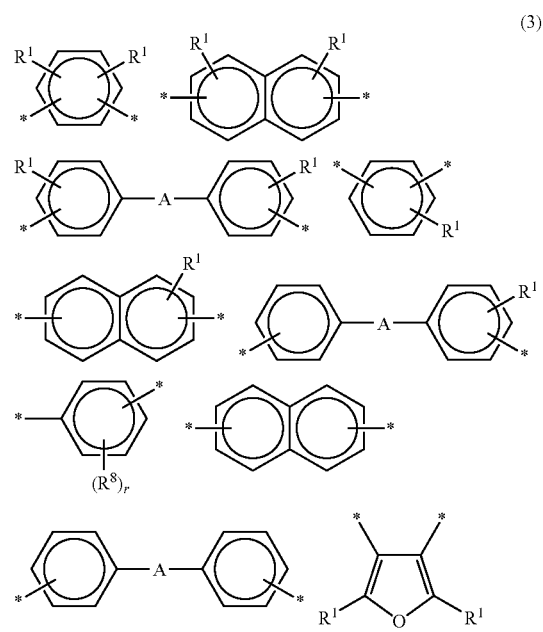

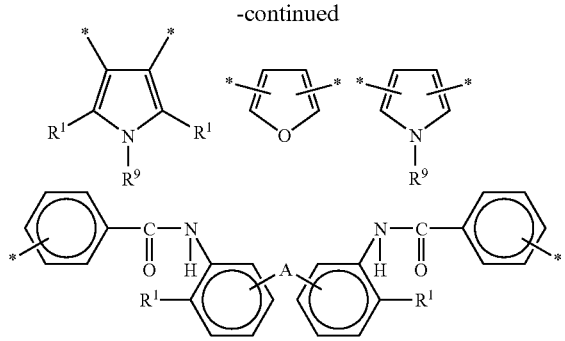

wherein A represents —CH₂—, —C(CH₃)₂—, —O—, —S—, —SO₂—, —CO—, —NHCO—, —C(CF₃)₂—, or a single bond, $R^8$ represents an alkyl group, an alkyl ester group, or a halogen atom ($R^8$ may be the same or different when r is two or more), r is an integer from 0 to 2, $R^9$ represents a hydrogen atom, an alkyl group, an alkyl ester group, or a halogen atom, and the asterisk (*) indicates the presence of an NH group. Note that $R^8$ and $R^9$ in the formula (3) are selected independently of $R^1$ in the formula (1).

Among the organic groups shown by the formula (3), organic groups shown by the following formula (4) are preferable since the resulting positive-type photosensitive resin composition exhibits an excellent patterning capability, and the resulting cured film exhibits excellent properties. These organic groups may be used either individually or in combination.

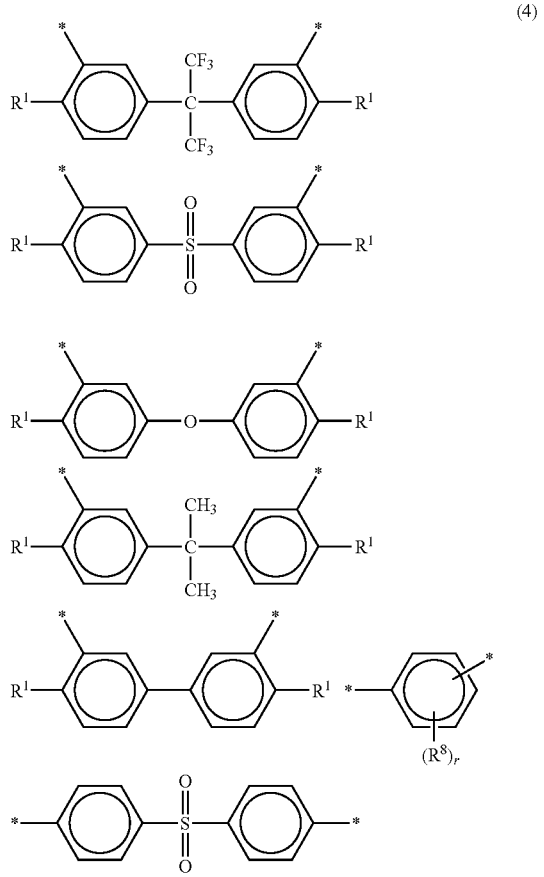

(4)

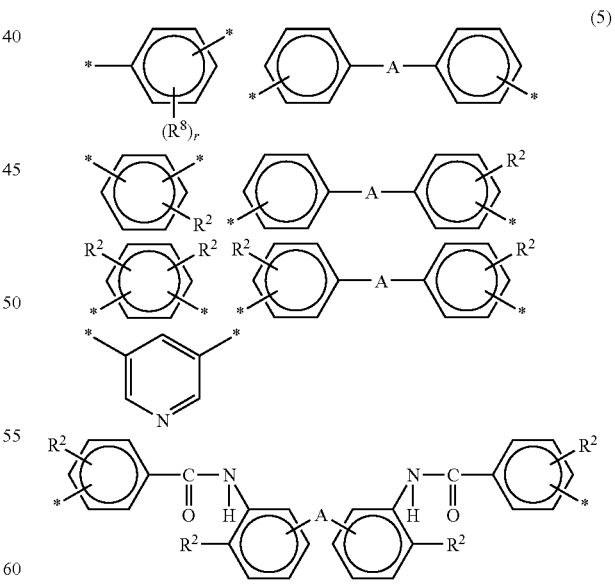

(5)

wherein $R^8$ represents an alkyl group, an alkyl ester group, or a halogen atom ($R^8$ may be the same or different when r is two or more), r is an integer from 0 to 2, and the asterisk (*) indicates the presence of an NH group. Note that $R^8$ in the formula (3) is selected independently of $R^1$ in the formula (1).

In the formulas (1) and (2), Y represents an organic group, and preferably an aromatic group. Examples of the organic group represented by Y include organic groups shown by the following formula (5) and organic groups shown by the following formula (6). These organic groups may be used either individually or in combination.

wherein A represents —CH₂—, —C(CH₃)₂—, —O—, —S—, —SO₂—, —CO—, —NHCO—, —C(CF₃)₂—, or a single bond, $R^8$ represents an alkyl group, an alkyl ester group, or a halogen atom ($R^8$ may be the same or different when r is two or more), and r represents an integer from 0 to 2. Note that $R^8$ in the formula (5) is selected independently of $R^2$ in the formulas (1) and (2). The asterisk (*) indicates the presence of a CO group.

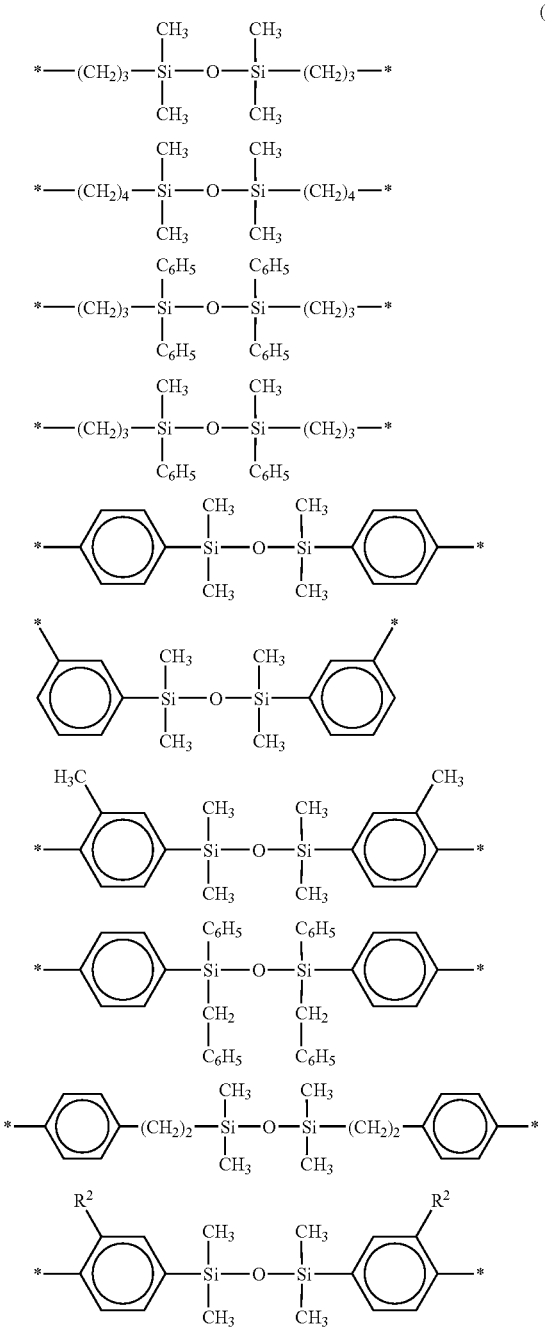

wherein the asterisk (*) indicates the presence of a CO group.

Among the organic groups shown by the formula (5) and the organic groups shown by the formula (6), organic groups shown by the following formula (7) and organic groups shown by the following formula (8) are preferable since the resulting positive-type photosensitive resin composition exhibits an excellent patterning capability, and the resulting cured film exhibits excellent properties. These organic groups may be used either individually or in combination.

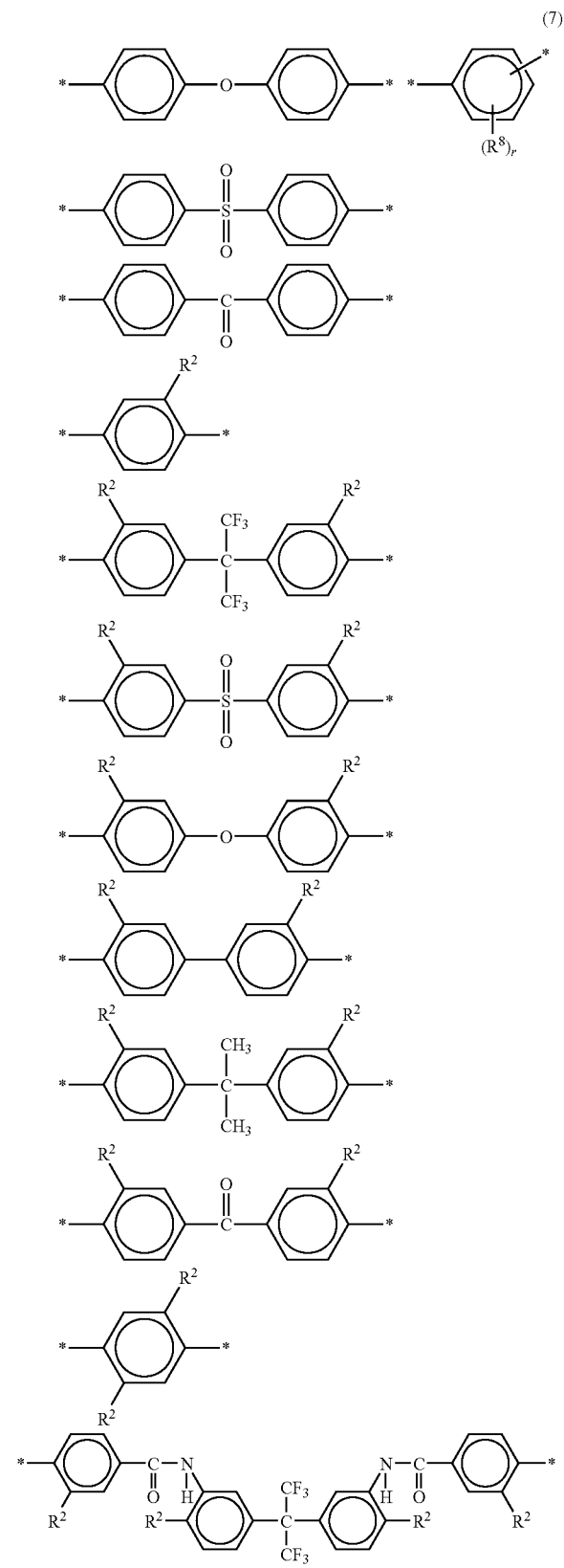

wherein $R^8$ represents an alkyl group, an alkyl ester group, or a halogen atom ($R^8$ may be the same or different when r is two or more), r represents an integer from 0 to 2, and the asterisk (*) indicates the presence of a CO group. Note that $R^8$ in the formula (7) is selected independently of $R^2$ in the formulas (1) and (2).

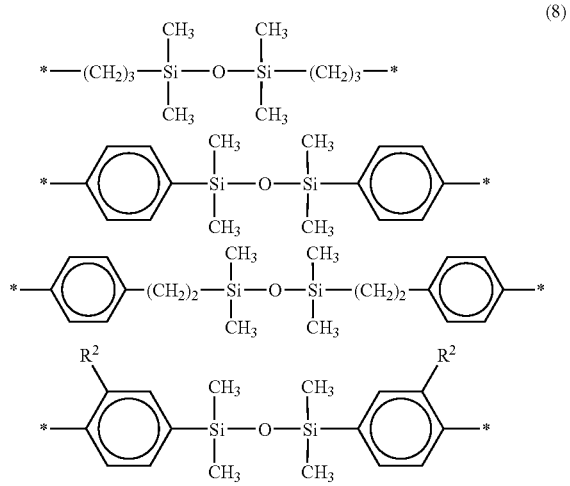

(8)

wherein the asterisk (*) indicates the presence of a CO group.

In the formula (2), Z represents $-R^4-Si(R^6)(R^7)-O-Si(R^6)(R^7)-R^5-$ (i.e., an organic group shown by the following formula (9)).

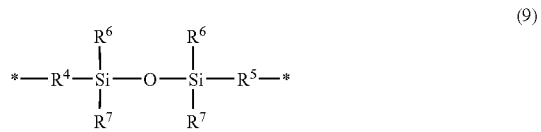

(9)

wherein $R^4$ to $R^7$ represent organic groups, and preferably an alkyl group or an aryl group having 1 to 15 carbon atoms, and the asterisk (*) indicates the presence of an NH group.

In the formula (1), $R^1$ that substitutes X represents a hydroxyl group, $-O-R^3$, or an organic group having 1 to 5 carbon atoms ($R^1$ may be the same or different when m is two or more). In the formulas (1) and (2), $R^2$ that substitutes Y represents a hydroxyl group, a carboxyl group, $-O-R^3$, or $-COO-R^3$ ($R^2$ may be the same or different when n is two or more). Note that $R^3$ represents an organic group having 1 to 15 carbon atoms. At least one $R^2$ is a carboxyl group when $R^1$ is not a hydroxyl group. At least one $R^1$ is a hydroxyl group when $R^2$ is not a carboxyl group. m represents an integer from 0 to 4, and n represents an integer from 0 to 4.

Examples of the organic group having 1 to 5 carbon atoms represented by $R^1$ in the formula (1) that substitutes X include, but are not limited to, a methyl group, an ethyl group, a propyl group, an isopropyl group, a t-butyl group, a methoxy group, an ethoxy group, a cyclohexyl group, and the like. Among these, a methyl group is preferable since a film having excellent properties can be obtained.

In the polyamide resin (A), $-O-R^3$ that substitutes X and $-O-R^3$ or $-COO-R^3$ that substitutes Y are groups in which a hydroxyl group or a carboxyl group is protected by $R^3$ (i.e., an organic group having 1 to 15 carbon atoms) in order to adjust the solubility of the hydroxyl group or carboxyl group in an alkaline aqueous solution. The hydroxyl group or carboxyl group is optionally protected. Examples of $R^3$ include a formyl group, a methyl group, an ethyl group, a propyl group, an isopropyl group, a t-butyl group, a t-butoxycarbonyl group, a phenyl group, a benzyl group, a tetrahydrofuranyl group, a tetrahydropyranyl group, and the like.

In the formulas (1) and (2), a represents an integer equal to or larger than one, and b represents an integer equal to or larger than zero. Note that a and b in the formulas (1) and (2) merely indicate the numbers of structural units in the resin (i.e., the structural units are not necessarily continuously linked). In the polyamide resin (A), the mol % ($[a/(a+b)] \times 100$ (%)) of the structural unit shown by the formula (1) is 30 to 100, and the mol % ($[b/(a+b)] \times 100(\%)$) of the structural unit shown by the formula (2) is 0 to 70.

The weight average molecular weight (Mw) of the polyamide resin (A) is 5000 to 80,000, preferably 8000 to 60,000, and particularly preferably 10,000 to 40,000. If the weight average molecular weight (Mw) of the polyamide resin (A) is within the above range, the resulting composition exhibits an excellent patterning capability, and the resulting cured film exhibits excellent properties.

The polyamide resin (A) is dehydrated and cyclized upon heating to form a heat resistant resin (i.e., a polyimide resin, a polybenzoxazole resin, or a copolymer thereof).

In the present invention, the end of the polyamide resin (A) may be capped (sealed) from the viewpoint of improving the storage stability of the positive-type photosensitive resin composition. In this case, a derivative containing an aliphatic group or a cyclic compound group having at least one alkenyl group or alkynyl group may be introduced into the end of the polyamide resin (A) as an acid derivative or an amine derivative.

For example, a diamine compound selected from a diamine, bis(aminophenol), and 2,4-diaminophenol containing X is reacted with an acid compound selected from a tetracarboxylic anhydride, trimellitic anhydride, dicarboxylic acid, dicarboxylic acid dichloride, dicarboxylic acid derivative, hydroxydicarboxylic acid, and hydroxydicarboxylic acid derivative containing Y to synthesize the polyamide resin (A), and the amino group positioned on the end of the polyamide resin (A) is capped as an amide using an acid anhydride or an acid derivative containing an aliphatic group or a cyclic compound group having at least one alkenyl group or alkynyl group. Note that part of the end of the polyamide resin (A) may be cyclized due to heat of reaction.

Examples of the end-capping functional group for the polyamide resin (A) include functional groups shown by the following formulas (10-1) and (10-2). These functional groups may be used either individually or in combination.

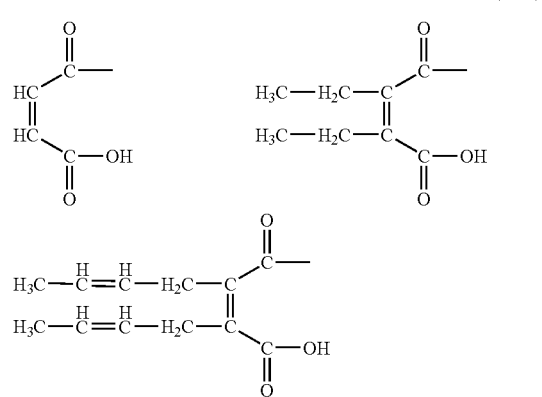

(10-1)

-continued

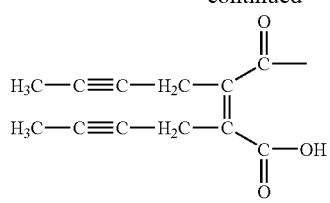
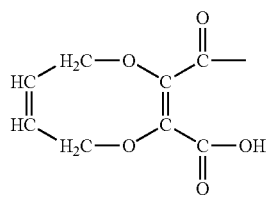
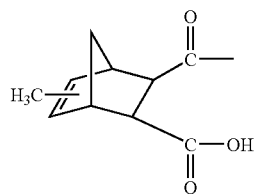
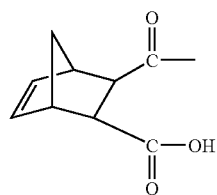
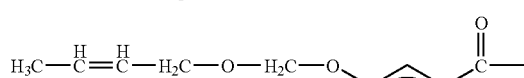
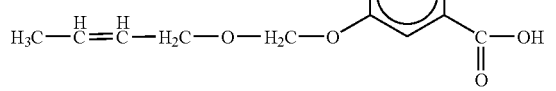

(10-2)

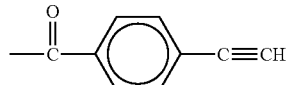
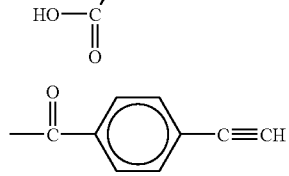
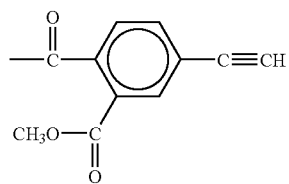
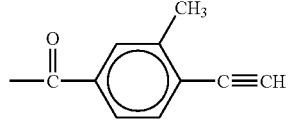

-continued

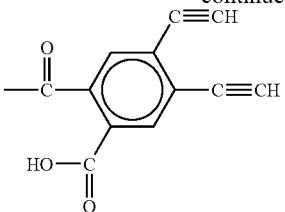
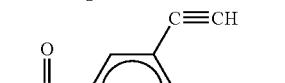
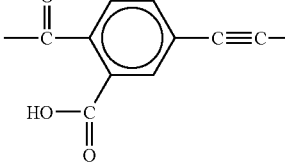
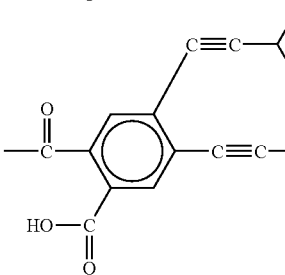

Among the functional groups shown by the following formulas (10-1) and (10-2), functional groups shown by the following formula (11) are preferable. These functional groups may be used either individually or in combination.

(11)

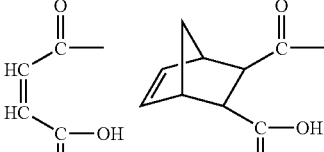
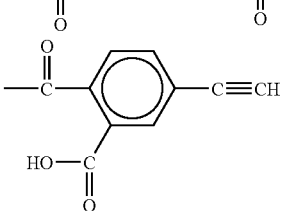

Note that the end of the polyamide resin (A) may be capped by another method. For example, the acid positioned on the end of the polyamide resin (A) may be capped as an amide using an amine derivative containing an aliphatic group or a cyclic compound group having at least one alkenyl group or alkynyl group.

The photosensitive compound (B) included in the positive-type photosensitive resin composition according to the present invention is a compound having a 1,2-benzoquinonediazido structure or a 1,2-naphthoquinonediazido structure. Such a compound is disclosed in U.S. Pat. No. 2,772,975, No. 2,797,213, and No. 3,669,658.

Examples of the photosensitive compound (B) include compounds shown by the following formulas (12) to (16).
(12)
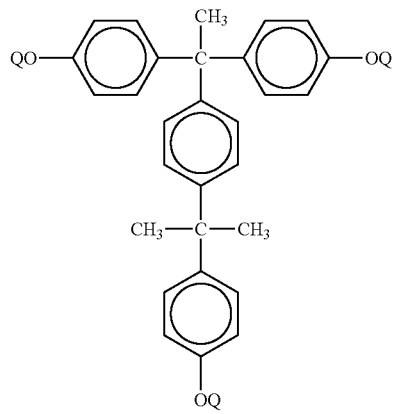
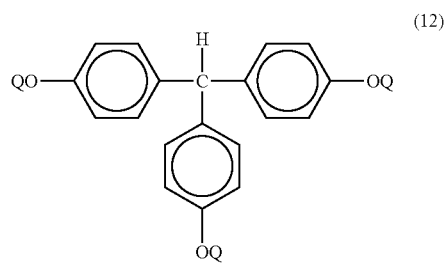
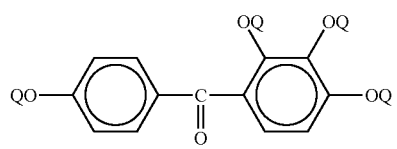
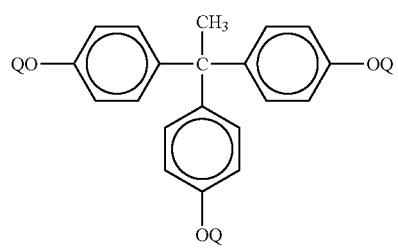
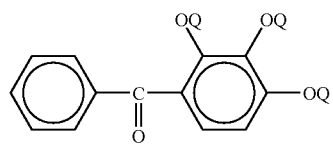
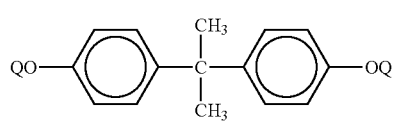
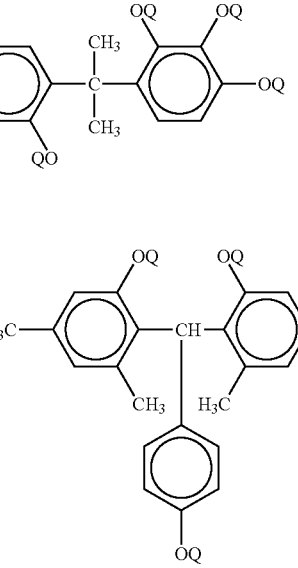
(13)
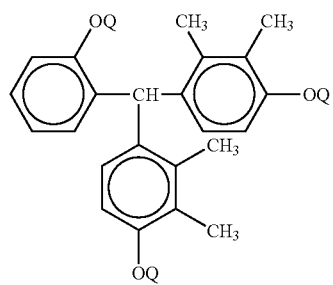
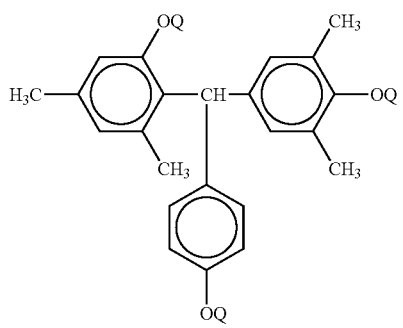

-continued
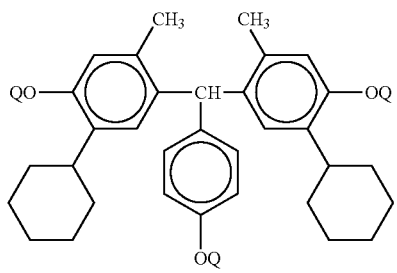
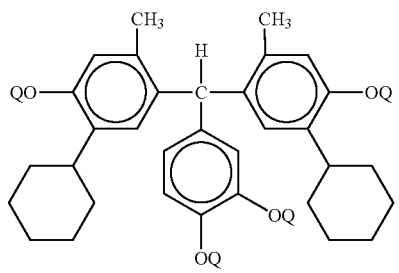
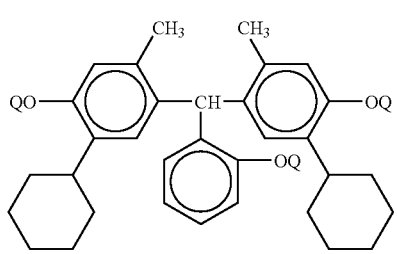
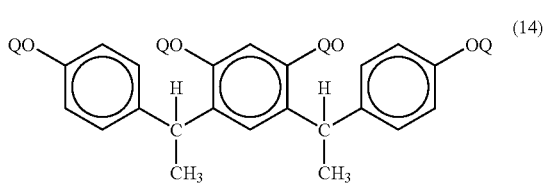
(14)
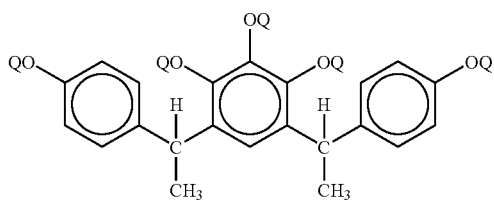
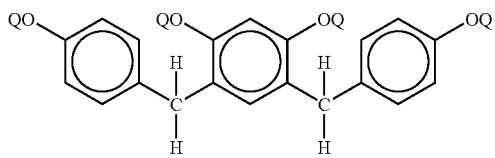
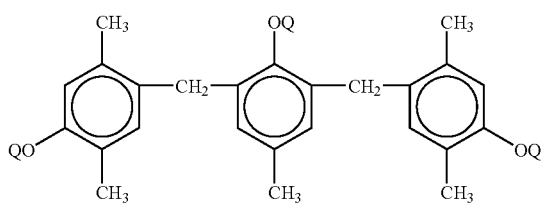
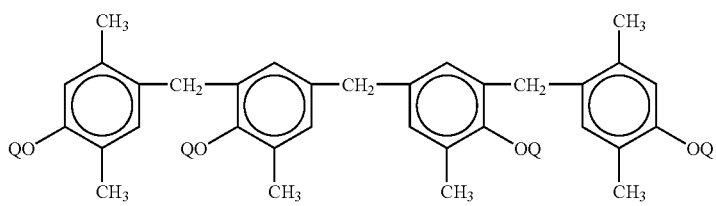
(15)
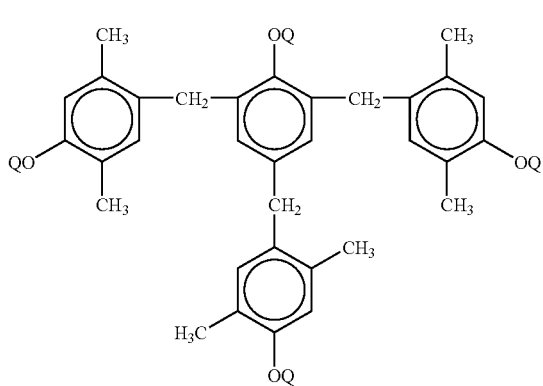

-continued
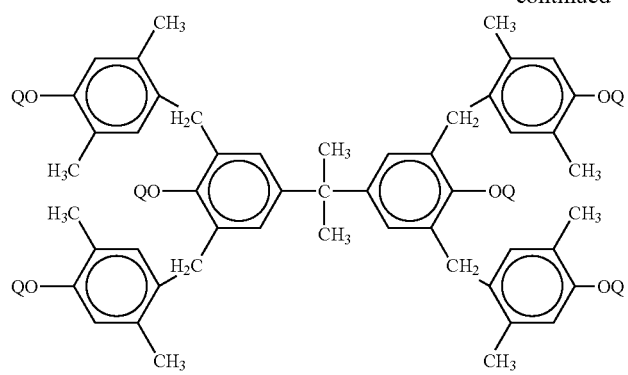
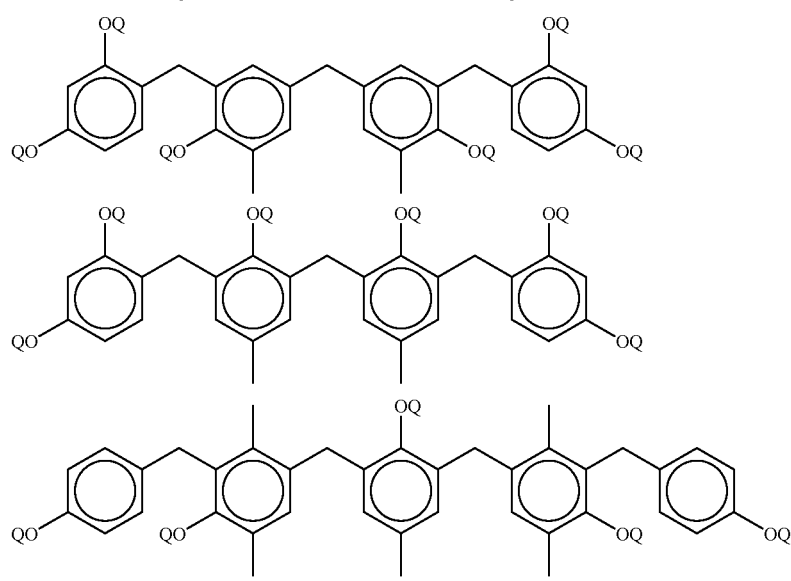
(16)
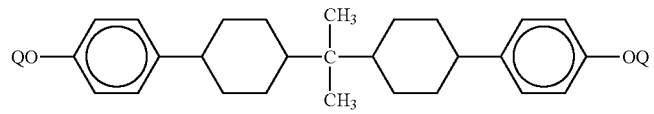
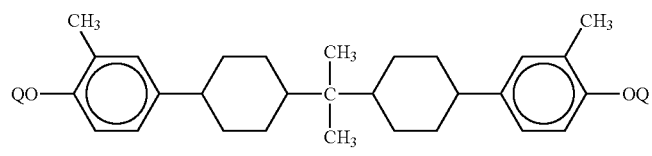
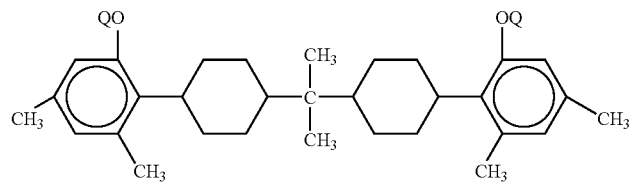
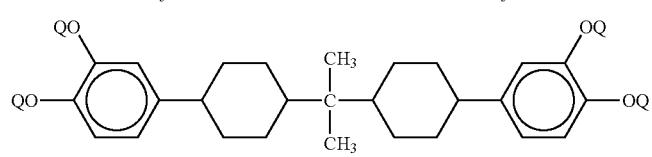
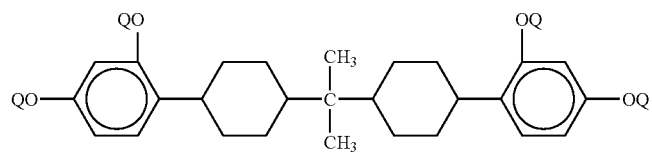

-continued

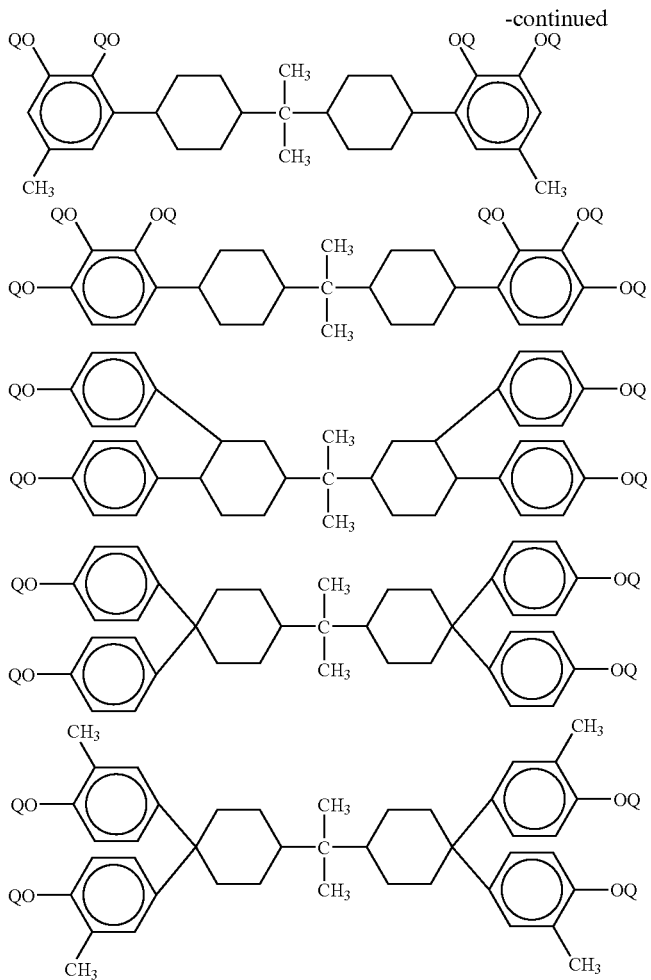

wherein Q is selected from a hydrogen atom and the groups shown by the following formulas (17) and (18). These groups may be used either individually or in combination. Note that at least one Q in the compounds shown by the formulas (12) to (16) is the group shown by the formula (17) or (18).

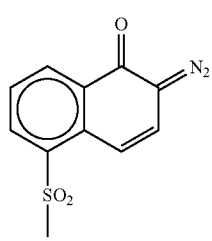
(17)

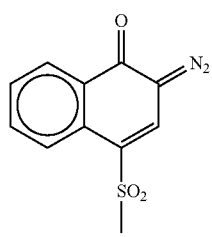
(18)

The amount of the photosensitive compound (B) used in the positive-type photosensitive resin composition according to the present invention is preferably 1 to 50 parts by weight, and particularly preferably 10 to 40 parts by weight, based on 100 parts by weight of the polyamide resin (A). If the amount of the photosensitive compound (B) is within the above range, an excellent pattern formation capability and sensitivity can be achieved.

The positive-type photosensitive resin composition according to the present invention may include (C) a phenolic hydroxyl group-containing compound so that the composition can be patterned with high sensitivity without producing a scum.

Examples of the phenolic hydroxyl group-containing compound (C) used in the positive-type photosensitive resin composition according to the present invention include the compounds shown by the following formula (20). These compounds may be used either individually or in combination.

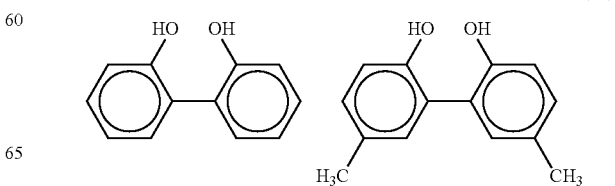
(20)

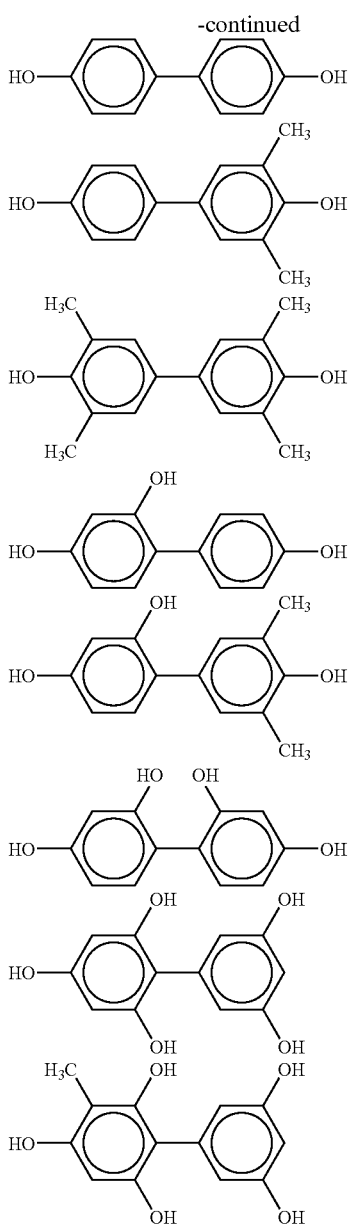

The amount of the phenolic hydroxyl group-containing compound (C) used in the positive-type photosensitive resin composition according to the present invention is not particularly limited, but is preferably 1 to 30 parts by weight, and particularly preferably 1 to 20 parts by weight, based on 100 parts by weight of the polyamide resin (A). If the amount of the phenolic hydroxyl group-containing compound (C) is within the above range, the solubility of an exposed area is improved during exposure (i.e., sensitivity is improved), and occurrence of a scum during development is suppressed.

The positive-type photosensitive resin composition according to the present invention may include a silane coupling agent or a silicon compound in order to improve adhesion to a silicon wafer or a substrate. Examples of the silane coupling agent include an aminosilane, epoxysilane, acrylic silane, mercaptosilane, vinylsilane, ureidosilane, sulfide silane, and the like. Among these, an aminosilane is preferable. Examples of the aminosilane include bis(2-hydroxyethyl)-3-aminopropyltriethoxysilane, γ-aminopropyltriethoxysilane, γ-aminopropyltrimethoxysilane, γ-aminopropylmethyldiethoxysilane, γ-aminopropylmethyldimethoxysilane, N-β-(aminoethyl)-γ-aminopropyltrimethoxysilane, N-β-(aminoethyl)-γ-aminopropyltriethoxysilane, N-β-(aminoethyl)-γ-aminopropylmethyldimethoxysilane, N-β-(aminoethyl)-γ-aminopropylmethyldiethoxysilane, N-phenyl-γ-aminopropyltrimethoxysilane, and the like. Examples of the epoxysilane include γ-glycidoxypropyltrimethoxysilane, γ-glycidoxypropylmethyldiethoxysilane, β-(3,4-epoxycyclohexyl)ethyltrimethoxysilane, and the like. Examples of the acrylic silane include γ-(methacryloxypropyl)trimethoxysilane, γ-(methacryloxypropyl)methyldimethoxysilane, γ-(methacryloxypropyl)methyldiethoxysilane, and the like. Examples of the mercaptosilane include γ-mercaptopropyltrimethoxysilane and the like. Examples of the vinylsilane include vinyltris(β-methoxyethoxy)silane, vinyltriethoxysilane, vinyltrimetoxysilane, and the like. Examples of the ureidosilane include 3-ureidopropyltriethoxysilane and the like. Examples of the sulfide silane include bis(3-(triethoxysilyl)propyl)disulfide, bis(3-(triethoxysilyl)propyl)tetrasulfide, and the like. Examples of the silicon compound include the silicon compounds shown by the following formulas (21) and (22).

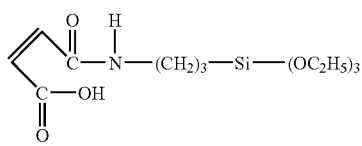

(21)

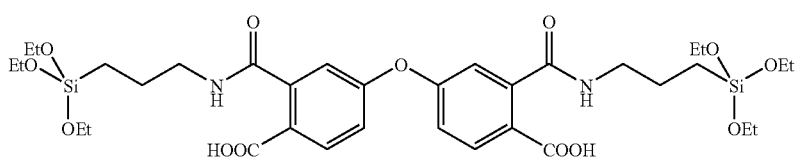

(22)

Among these, bis(2-hydroxyethyl)-3-aminopropyltriethoxysilane, γ-(methacryloxypropyl)trimethoxysilane, and the silicon compounds shown by the formulas (21) and (22) are preferable.

The positive-type photosensitive resin composition according to the present invention may further include additives such a catalyst that promotes a curing reaction and a leveling agent, as required.

The positive-type photosensitive resin composition according to the present invention is dissolved in a solvent, and used in the form of a varnish. Examples of the solvent include N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl 3-methoxypropionate, and the like. These solvents may be used either individually or in combination.

The positive-type photosensitive resin composition according to the present invention is used as described below. Specifically, the positive-type photosensitive resin composition according to the present invention is applied to an appropriate substrate such as a silicon wafer, a ceramic substrate, or an aluminum substrate. When producing a semiconductor device, the positive-type photosensitive resin composition is applied so that the resulting cured film has a thickness of 0.1 to 30 µm. If the thickness of the cured film is less than 0.1 µm, the film may not fully function as a surface protective film of a semiconductor element. If the thickness of the cured film is more than 30 µm, it may be difficult to form a fine pattern. Moreover, processing may take time so that the throughput may decrease. The positive-type photosensitive resin composition is applied by spin coating using a spinner, spray coating using a spray coater, immersion, printing, roll coating, or the like. The film of the positive-type photosensitive resin composition formed on the substrate is prebaked at 60 to 130° C., dried, and irradiated with chemical rays to form a desired pattern. As the chemical rays, X-rays, electron beams, ultraviolet rays, visible rays, or the like may be used. It is preferable to use chemical rays having a wavelength of 200 to 500 nm.

The irradiated area is dissolved and removed using a developer to obtain a relief pattern. Examples of the developer include an aqueous solution of an alkali compound such as an inorganic alkali compound (e.g., sodium hydroxide, potassium hydroxide, sodium carbonate, sodium silicate, sodium metasilicate, and aqueous ammonia water), a primary amine (e.g., ethylamine and n-propylamine), a secondary amine (e.g., diethylamine and di-n-propylamine), a tertiary amine (e.g., triethylamine and methyldiethylamine), an alcohol amine (e.g., dimethylethanolamine and triethanolamine), or a quaternary ammonium salt (e.g., tetramethylammonium hydroxide and tetraethylammonium hydroxide), and an aqueous solution that further contains an appropriate amount of a water-soluble organic solvent such as an alcohol (e.g., methanol and ethanol) or a surfactant. As the development method, a spray development method, a paddle development method, an immersion development method, an ultrasonic development method, or the like may be used.

The relief pattern formed by development is then rinsed. Distilled water is used as the rinsing liquid. The resulting product is heated to form an oxazole ring or an imide ring. A pattern having excellent heat resistance is thus obtained.

The development mechanism of the positive-type photosensitive resin composition is as follows. Specifically, the unexposed area exhibits poor solubility in the alkaline solution due to the dissolution suppression effect of the polybenzoxazole resin or polyimide resin by the diazoquinone compound. On the other hand, the diazoquinone compound chemically changes in the exposed area, and becomes soluble in the alkaline aqueous solution. A film pattern formed only of the unexposed area is obtained by dissolving and removing the exposed area by utilizing the difference in solubility between the exposed area and the unexposed area.

A cured film obtained by curing the positive-type photosensitive resin composition according to the present invention at 250° C. has a tensile modulus of elasticity of 2.0 to 4.0 GPa, and preferably 2.1 to 3.7 GPa. If the tensile modulus of elasticity of the cured film is within the above range, when encapsulating a semiconductor element that includes the cured film of the positive-type photosensitive resin composition as a protective film or an insulating film using an encapsulation material, a situation in which cracks occur in the insulating film or the protective film due to a filler (silica) contained in the encapsulation resin that encapsulates the semiconductor element can be prevented. Moreover, when subjecting a semiconductor device having a semiconductor element that includes the cured film of the positive-type photosensitive resin composition as a protective film or an insulating film to a temperature cycle test, occurrence of cracks or delamination of the insulating film or the protective film can be prevented.

The tensile modulus of elasticity of the cured film is measured by the following method. Specifically, the positive-type photosensitive resin composition is applied to an 8-inch silicon wafer so that the cured film has a thickness of about 10 µm, and cured in a clean oven ("CLH-21CDL" manufactured by Koyo Thermo System Co., Ltd.) at 250° C. for 90 minutes in a nitrogen atmosphere. The resulting cured film is immersed in 2% aqueous hydrogen fluoride to remove the cured film from the silicon wafer. The cured film is then sufficiently washed with purified water, and dried in an oven at 60° C. for five hours. The cured film is cut in the shape of a strip (width: 10 mm, length: 120 mm) to obtain a tensile test specimen. The specimen is subjected to a tensile test using a tensile tester at a tensile rate of 5 mm/min to calculate the tensile modulus of elasticity.

A cured film obtained by curing the positive-type photosensitive resin composition according to the present invention at 250° C. has a tensile elongation of 10 to 100%, and preferably 15 to 100%. If the tensile elongation of the cured film is within the above range, a situation in which cracks occur in an insulating film or a protective film can be prevented. Moreover, sufficient adhesion can be achieved during a high-temperature process employed for a semiconductor device.

The tensile elongation of the cured film is measured by the following method. Specifically, the positive-type photosensitive resin composition is applied to an 8-inch silicon wafer so that the cured film has a thickness of about 10 µm, and cured in a clean oven ("CLH-21CDL" manufactured by Koyo Thermo System Co., Ltd.) at 250° C. for 90 minutes in a nitrogen atmosphere. The resulting cured film is immersed in 2% aqueous hydrogen fluoride to remove the cured film from the silicon wafer. The cured film is then sufficiently washed with purified water, and dried in an oven at 60° C. for five hours. The cured film is cut in the shape of a strip (width: 10 mm) to obtain a tensile test specimen. The cured film is cut in the shape of a strip (width: 10 mm, length: 120 mm) to obtain a tensile test specimen. The specimen is subjected to a tensile test using a tensile tester at a tensile rate of 5 mm/min to calculate the tensile elongation.

The tensile modulus of elasticity and the tensile elongation of the cured film obtained by curing the positive-type photosensitive resin composition according to the present invention may be adjusted to values within the above ranges by controlling the molecular weight of the polyamide resin (A), or appropriately selecting the structures of the amine compound and the carboxylic acid that form the polyamide resin (A), for example.

The cyclization rate ratio ([A]/[B]) of the cyclization rate ([A]%) of a cured film obtained by curing the positive-type photosensitive resin composition according to the present invention at 250° C. to the cyclization rate ([A]%) of a cured film obtained by curing the positive-type photosensitive resin composition according to the present invention at 300° C. is preferably 0.30 or more, and particularly preferably 0.3 to 1.0. If the cyclization rate ratio ([A]/[B]) is within the above range, the cyclization reaction of the polyamide resin (A) proceeds even when curing the positive-type photosensitive resin composition at a low temperature of 250° C. Therefore, a phenolic hydroxyl group or a carboxyl group of the polyamide resin decrease so that an increase in water absorption of the cured film can be suppressed. As a result, a semiconductor device that exhibits excellent moisture resistance and chemical resistance and has a low dielectric constant can be obtained. Since the variation in the performance of the cured film is small even when curing the positive-type photosensitive resin composition over a wide temperature range (i.e., 250 to 300° C.), the yield of the semiconductor device can be increased.

The cyclization rate of the positive-type photosensitive resin composition is measured by the following method. Specifically, the positive-type photosensitive resin composition is applied to an 8-inch silicon wafer so that the cured film has a thickness of about 10 µm, and cured in a clean oven ("CLH-21CDL" manufactured by Koyo Thermo System Co., Ltd.) at 250° C. for 90 minutes in a nitrogen atmosphere. The resulting cured film is immersed in 2% aqueous hydrogen fluoride to remove the cured film from the silicon wafer. A cured film X cured at 250° C. is thus obtained. The positive-type photosensitive resin composition is separately cured at 150° C. for 30 minutes and at 300° C. for 60 minutes, and subjected to the above treatment to obtain a cured film Y cured at 300° C. The cyclization rates of the cured films X and Y are measured using an infrared spectrophotometer (FT-IR, Parkin Elmer Paragon 1000) using the following expressions, and the cyclization rate ratio ([A]/[B]) is calculated.

Cyclization rate [A]% at 250° C.: $(b/a) \times 100$

Cyclization rate [B]% at 300° C.: $(d/c) \times 100$ a: Peak length attributed to all aromatic rings of cured film X at 1490 cm$^{-1}$
b: Peak length attributed to an oxazole rings of cured film X at 1051 cm$^{-1}$
c: Peak length attributed to all aromatic rings of cured film Y at 1490 cm$^{-1}$
d: Peak length attributed to an oxazole rings of cured film Y at 1051 cm$^{-1}$ The cyclization rate ratio ([A]/[B]) when curing the positive-type photosensitive resin composition according to the present invention may be adjusted to a value within the above range by utilizing a catalyst that promotes cyclization, appropriately selecting the type of catalyst, or appropriately selecting the structures of the amine compound and the carboxylic acid that form the polyamide resin (A), for example.

A cured film obtained by curing the positive-type photosensitive resin composition according to the present invention at 250° C. preferably has a glass transition temperature (Tg) of 230 to 400° C., and particularly preferably 250 to 400° C. If the glass transition temperature (Tg) of the cured film is within the above range, excellent reflow resistance can be achieved while implementing high adhesion to a substrate.

The glass transition temperature (Tg) of the cured film is measured by the following thermal expansion method. Specifically, the positive-type photosensitive resin composition is applied to an 8-inch silicon wafer so that the cured film has a thickness of about 10 µm, and cured in a clean oven ("CLH-21CDL" manufactured by Koyo Thermo System Co., Ltd.) at 250° C. for 90 minutes in a nitrogen atmosphere. The resulting cured film is immersed in 2% aqueous hydrogen fluoride to remove the cured film from the silicon wafer. A cured film cured at 250° C. is thus obtained. The glass transition temperature of the cured film is measured in the air using a thermomechanical analyzer ("TMA/SS6100" manufactured by Seiko Instruments Inc.) at a tensile load of 0.048 N and a temperature rise rate of 10° C./min.

The thickness change rate shown by the following expression (1) is preferably within ±1% when immersing a cured film obtained by curing the positive-type photosensitive resin composition according to the present invention at 250° C. in a flux cleaning agent ("Pine Alpha St-100SX" manufactured by Arakawa Chemical Industries, Ltd.) at 50° C. for 10 minutes.

Thickness change rate (%)=[(thickness after immersion/thickness before immersion)×100]−100     (1)

If the thickness change rate of the cured film is within the above range, it is possible to obtain a cured film that exhibits excellent chemical resistance against a flux-cleaning alcohol solvent or hydrocarbon solvent or an aqueous flux cleaning agent used when placing a solder bump on a protective film formed of the cured film of the positive-type photosensitive resin composition in a wafer-level package production process.

The thickness change rate of the cured film is measured by the following method. Specifically, the positive-type photosensitive resin composition is applied to an 8-inch silicon wafer so that the cured film has a thickness of about 10 µm, and cured in a clean oven ("CLH-21CDL" manufactured by Koyo Thermo System Co., Ltd.) at 250° C. for 90 minutes in a nitrogen atmosphere. The resulting cured film is immersed in an aqueous solvent ("ST-100SX" manufactured by Arakawa Chemical Industries, Ltd.) at 50° C. for 10 minutes. The thickness change rate is measured by the expression (1) using the thickness before immersion and the thickness after immersion.

The positive-type photosensitive resin composition according to the present invention is useful for semiconductor applications, and is also useful as an interlayer dielectric for a multilayer circuit board, a cover coat for a flexible copper-clad laminate, a solder resist film, a liquid crystal alignment film, an interlayer dielectric for a display device, and the like.

Examples of the semiconductor applications include a passivation film obtained by forming a cured film of the positive-type photosensitive resin composition according to the present invention on a semiconductor element, a buffer coat film obtained by forming a cured film of the positive-type photosensitive resin composition according to the present invention on a passivation film formed on a semiconductor element, an interlayer dielectric obtained by forming a cured film of the positive-type photosensitive resin composition according to the present invention on a circuit formed on a semiconductor element, a protective film or an insulating film used for a wafer-level package (hereinafter may be referred to as "WLP"), and the like.

Examples of the display device applications include a TFT interlayer dielectric, a TFT planarization film, a color filter planarization film, a protrusion for MVA liquid crystal displays, and a cathode partition wall for organic EL elements. In this case, the positive-type photosensitive resin composition is used in the same manner as in the semiconductor applications (i.e., a patterned cured film of the positive-type photosensitive resin composition is formed on a substrate provided with a display element member and a color filter using the above method). High transparency is desired for the display device applications (particularly for an insulating layer or a planarization film). A resin layer that exhibits excellent transparency can be obtained by introducing a post-exposure step before curing the positive-type photosensitive resin composition.

The positive-type photosensitive resin composition according to the present invention may be suitably used as a WLP protective film or insulating film.

One embodiment of a WLP semiconductor device utilizing the positive-type photosensitive resin composition according to the present invention is described below with reference to the drawings. Note that the present invention is not limited to the following embodiment.

FIG. 1 is a cross-sectional view showing a WLP. A passivation film 3 is formed on a silicon wafer 1 on which a signal input/output aluminum pad 2 is formed. A via-hole is formed in the passivation film 3. A protective film 4 formed of a cured film of the positive-type photosensitive resin composition according to the present invention is formed on the passivation film 3. A metal (Cr or Ti layer) film 5 is formed to be connected to the aluminum pad 2. The metal film 5 is removed by etching around a solder bump 12 to insulate pads. A barrier metal 8 and the solder bump 12 are formed on the insulated pad.

A method of producing the WLP semiconductor device is described below with reference to FIGS. 2 to 4.

Figure 2:
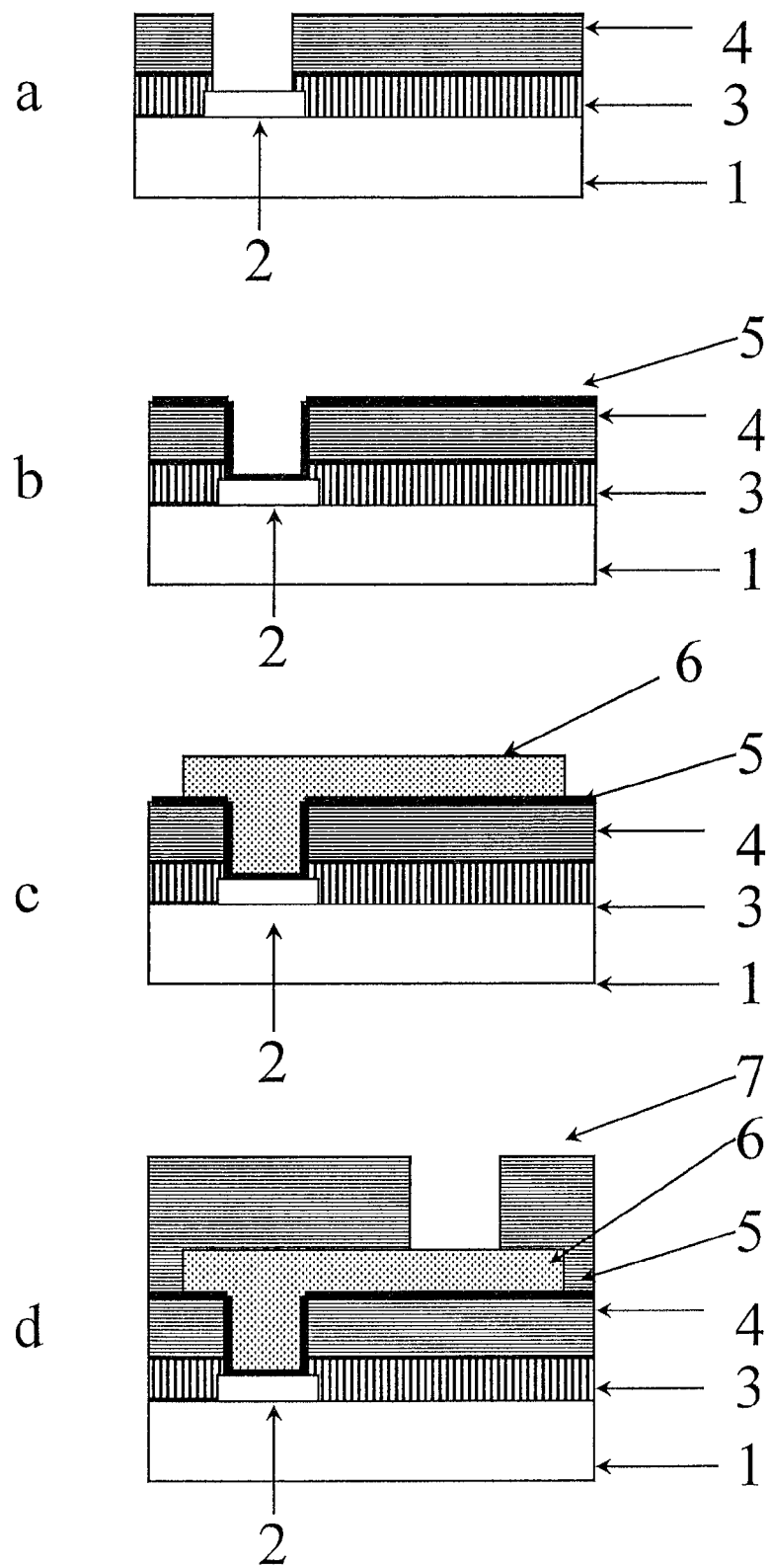
FIG. 2 is a schematic view (1) showing a WLP semiconductor device production process.

FIG. 2-a shows a step that forms a buffer coat film (protective film) 4 on the silicon wafer 1 on which the passivation film 3 is formed on the signal input/output aluminum pad 2. Specifically, the positive-type photosensitive resin composition according to the present invention is spin-coated to a given thickness onto the silicon wafer 1 on which the passivation film is formed on the signal input/output aluminum pad 2. The positive-type photosensitive resin composition is then prebaked to volatilize the solvent contained in the positive-type photosensitive resin composition. A mask is placed so that only the aluminum pad 2 can be selectively irradiated with chemical rays. The positive-type photosensitive resin composition is then exposed to an i-line, and developed in an alkaline developer (TMAH 2.38%) to remove the photosensitive resin composition exposed to the i-line. The photosensitive resin composition is then cured at 250 to 350° C. for a given time to form a buffer coat film.

FIG. 2-b shows a step that forms the metal film 5 (e.g., Cr or Ti) on the buffer coat film. The metal film allows a wiring layer 6 (e.g., Al or Cu layer) to be easily formed on the metal film 5. The metal film is formed over the entire silicon wafer 1 by sputtering (deposition). A mask is placed so that only the area over the aluminum pad 2 can be removed by RIE, and the metal film 5 over the aluminum pad 2 is removed by RIE.

FIG. 2-c is a step that forms the wiring layer 6 (e.g., Al or Cu layer) on the metal film 5. The wiring layer is formed by forming a thin film by sputtering, and increasing the thickness of the thin film to a given thickness by plating.

FIG. 2-d is a step that forms an insulating film 7 on the wiring layer 6. The insulating film 7 is formed in the same manner as the buffer coat film 4 (see FIG. 2-a).

Figure 3:
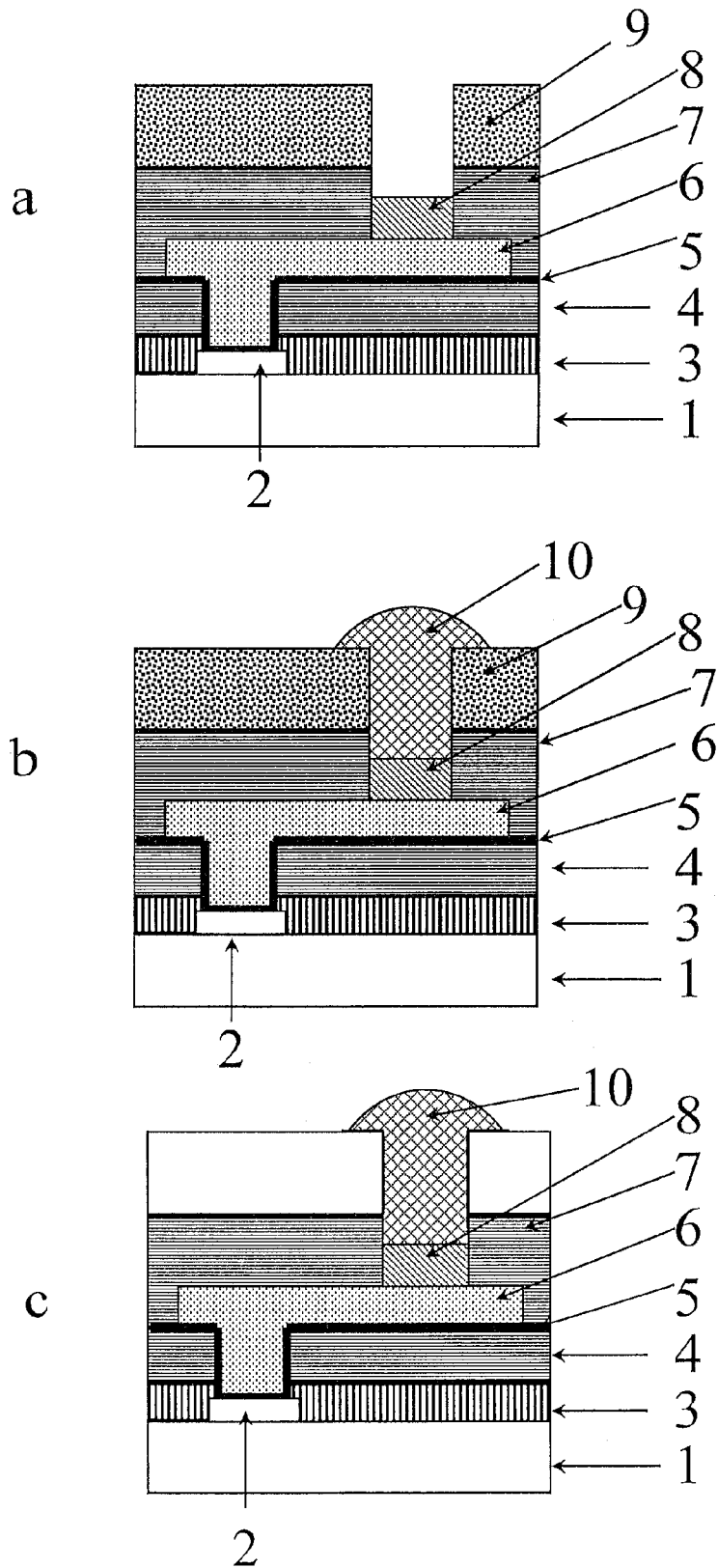
FIG. 3 is a schematic view (2) showing a WLP semiconductor device production process.

FIG. 3-a is a step that forms a barrier metal 8 and a resist 9 on the wiring layer 6. The barrier metal 8 has the same function as that of the metal film 5, and facilitates application of solder 10. The barrier metal 8 is selectively formed by sputtering on the wiring layer 6. The resist 9 is applied in an area other than the bump formation area in order to form a bump on the wiring layer 6, followed by patterning.

FIG. 3-b shows a step that applies solder to the barrier metal 8. Sn—Ag, Sn—Ag—Cu, Sn—Bi, or eutectic solder is used, and applied by plating.

FIG. 3-c is a step that removes the resist 9.

FIG. 4-a is a step that forms flux 11 around the solder 10. The flux 11 removes an oxide film on the surface of the solder 10 upon heating. A commercially available rosin flux is used as the flux 11.

FIG. 4-b is a step that forms the solder bump 12 by heating. The heating temperature is preferably equal to or higher than the melting point of the solder 10. For example, when using a eutectic mixture (melting point: 183° C.) as the solder 10, the heating temperature is preferably 190° C. or more. The oxide film on the surface of the solder 10 is removed by heating, and a solder bump 12 shown in FIG. 4-b is formed due to the surface tension of the solder. When the flux remains, the chemical resistance of the buffer coat film and the insulating film may decrease. Therefore, the flux is cleaned using an alcohol solvent, a hydrocarbon solvent, or an aqueous solvent, as required.

EXAMPLES

Example 1

Synthesis of Polyamide Resin

A four-necked separable flask equipped with a thermometer, a stirrer, a raw material inlet, and a dry nitrogen gas feed pipe was charged with a dicarboxylic acid derivative (32 mmol) obtained by reacting 8.26 g (32 mmol) of diphenyl ether-4,4'-dicarboxylic acid with 8.65 g (64 mmol) of 1-hydroxy-1,2,3-benzotriazole, and 11.5 g (40 mmol) of bis(3-amino-4-hydroxy-2,5-dimethylphenyl)methane. Then, 57.0 g of N-methyl-2-pyrrolidone was added to dissolve the mixture. The mixture was reacted at 75° C. for 12 hours using an oil bath. After the addition of 2.63 g (16 mmol) of 5-norbornene-2,3-dicarboxylic anhydride dissolved in 7 g of N-methyl-2-pyrrolidone, the mixture was stirred for 12 hours to complete the reaction. After filtering the reaction mixture, the reaction mixture was poured into a 3:1 (volume ratio) water/methanol mixture, and the precipitate was collected by filtration. The precipitate was then sufficiently washed with water, and dried under vacuum to obtain a polyamide resin (A-1). The polyamide resin (A-1) had a value "[a/(a+b)]× 100" of 80, and a weight average molecular weight (Mw) of 11,800. Note that the weight average molecular weight (Mw) used herein refers to a polystyrene-reduced molecular weight measured by GPC.

<Preparation of Positive-Type Photosensitive Resin Composition>

10 g of the polyamide resin (A-1) and 2 g of a photosensitive diazoquinone (B-1) having a structure shown by the following formula were dissolved in 20 g of γ-butyrolactone. The solution was filtered through a fluororesin filter having a pore size of 0.2 μm to obtain a positive-type photosensitive resin composition.

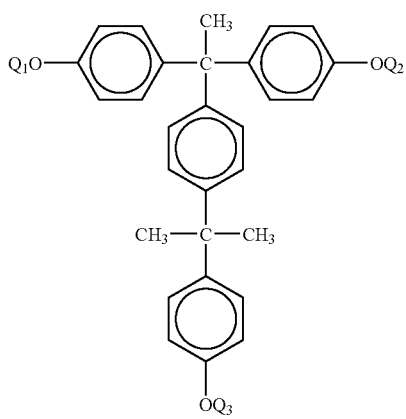

(B-1)

Note that 75% of Q1, Q2, and Q3 are groups shown by the following formula (23), and 25% of Q1, Q2, and Q3 are hydrogen atoms.

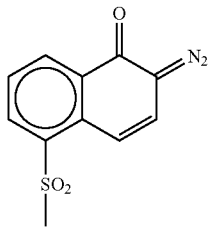

(23)

<Evaluation of Positive-Type Photosensitive Resin Composition>

The tensile modulus of elasticity, tensile elongation, cyclization rate ratio [A]/[B], glass transition temperature (Tg), thickness change rate, and patternability of the positive-type photosensitive resin composition were evaluated. The tensile modulus of elasticity, tensile elongation, cyclization rate ratio [A]/[B], glass transition temperature (Tg), and thickness change rate were evaluated as described above.

An example of applying the positive-type photosensitive resin composition to a semiconductor device is described below.

The positive-type photosensitive resin composition obtained in Example 1 was applied to an element in which an aluminum wire was provided in a comb shape, and prebaked at 120° C. for four minutes to obtain a film having a thickness of 8.2 μm. The film was exposed at a dose of 600 mJ/cm² using a mask aligner ("MA8" manufactured by SUSS), and developed using a 2.38% tetramethylammonium hydroxide (TMAH) % aqueous solution so that the reduction in thickness was about 1.5 μm (i.e., an electrode was exposed). The film was cured using a clean oven at 250° C. for 90 minutes in a nitrogen atmosphere to form an element in which a resin layer (thickness: about 5 μm) was formed on the aluminum wire. A redistribution layer (Ti/Al/Ti) was then deposited to a thickness of about 2 μm. After applying a resist, the film was patterned to form an opening at a position differing from that of the first layer. After immersing the product in 1% aqueous hydrogen fluoride, Ti was etched away. The product was then immersed in a solution (phosphoric acid/nitric acid/water=20/2/5) at 40° C., followed by etching. After immersing the product in 1% aqueous hydrogen fluoride, Ti was etched away. The resist was then removed using acetone. The positive-type photosensitive resin composition (second layer) was applied under the same conditions as described above to form a resin layer (thickness: about 5 μm) in which the electrode area was exposed. After applying a lift-off resist, the film was patterned. A TiW/NiV/Cu film (0.4 μm/0.3 μm/0.5 μm) was then deposited as a UBM film. The resist was removed utilizing high-pressure water to form a wafer in which an under barrier metal (UBM) was formed in the opening. The resulting wafer was immersed in acetic acid to remove an oxide film on the surface of copper, and sufficiently washed with purified water. Flux was applied to only the UBM using a solder ball mounter ("SBM361" manufactured by Shibuya Kogyo Co., Ltd.), a solder ball is places, followed by a reflow process at 220° C. for 30 seconds in a nitrogen atmosphere. The resulting product was immersed in an aqueous solvent ("ST-100SX" manufactured by Arakawa Chemical Industries, Ltd.) at 50° C. for 10 minutes to remove the flux to obtain a WLP having a two-layer structure.

Cracks or wrinkles in the cured film, and delamination between the layers were not observed.

Example 2

Synthesis of Polyamide Resin

A four-necked separable flask equipped with a thermometer, a stirrer, a raw material inlet, and a dry nitrogen gas feed pipe was charged with 6.89 g (8 mmol) of diamine shown by the following formula (24) and 27.12 g (74 mmol) of 2,2-bis (3-amino-4-hydroxyphenyl)hexafluoropropane, followed by the addition of 198 g of N-methyl-2-pyrrolidone. After the addition of a dicarboxylic acid derivative (70 mmol) obtained by reacting 18.03 g (70 mmol) of diphenyl ether-4,4'-dicarboxylic acid and 18.88 g (140 mmol) of 1-hydroxy-1,2,3-benzotriazole, the mixture was heated to 75° C. using an oil bath, and reacted for 12 hours. After the addition of 5.40 g (33 mmol) of 5-norbornene-2,3-dicarboxylic anhydride dissolved in 27 g of N-methyl-2-pyrrolidone, the mixture was stirred for 12 hours to complete the reaction. After filtering the reaction mixture, the reaction mixture was poured into a 3:1 (volume ratio) water/methanol mixture, and the precipitate was collected by filtration. The precipitate was then sufficiently washed with water, and dried under vacuum to obtain a polyamide resin (A-2). The polyamide resin (A-2) had a value "[a/(a+b)]×100" of 97, and a weight average molecular weight (Mw) of 13,600.

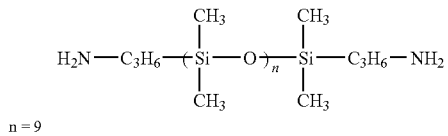

n = 9

(24)

<Preparation and Evaluation of Positive-Type Photosensitive Resin Composition>

A positive-type photosensitive resin composition was prepared and evaluated in the same manner as in Example 1, except that the polyamide resin (A-2) was used instead of the polyamide resin (A-1).

Example 3

Synthesis of Polyamide Resin

A four-necked separable flask equipped with a thermometer, a stirrer, a raw material inlet port, and a dry nitrogen gas feed pipe was charged with 14.7 g (68 mmol) of 3,3'-diaminobiphenyl-4,4'-diol and 202.7 g of N-methyl-2-pyrrolidone. The mixture was heated to 55° C. After the addition of 29 mmol of a dicarboxylic acid derivative obtained by reacting 7.47 g (29 mmol) of diphenyl ether-4,4'-dicarboxylic acid and 7.81 g (58 mmol) of 1-hydroxy-1,2,3-benzotriazole and 29 mmol of a dicarboxylic acid derivative obtained by reacting 4.81 g (29 mmol) of terephthalic acid and 7.82 g (58 mmol) of 1-hydroxy-1,2,3-benzotriazole, the mixture was reacted at 55° C. for 12 hours. After the addition of 4.47 g (27 mmol) of 5-norbornene-2,3-dicarboxylic anhydride dissolved in 22.35 g of N-methyl-2-pyrrolidone, the mixture was stirred at 55° C. for 12 hours to complete the reaction. After filtering the reaction mixture, the reaction mixture was poured into a 3:1 (volume ratio) water/methanol mixture, and the precipitate was collected by filtration. The precipitate was then sufficiently washed with water, and dried under vacuum to obtain a polyamide resin (A-3). The polyamide resin (A-3) had a value "[a/(a+b)]×100" of 32, and a weight average molecular weight (Mw) of 25,200.

<Preparation and Evaluation of Positive-Type Photosensitive Resin Composition>

A positive-type photosensitive resin composition was prepared and evaluated in the same manner as in Example 1, except that the polyamide resin (A-3) was used instead of the polyamide resin (A-1), and 10 g of the polyamide resin (A-3) and 2 g of the photosensitive diazoquinone (B-1) were dissolved in 20 g of N-methyl-2-pyrrolidone instead of 20 g of γ-butyrolactone.

Example 4

Synthesis of Polyamide Resin

A four-necked separable flask equipped with a thermometer, a stirrer, a raw material inlet port, and a dry nitrogen gas feed pipe was charged with 54.52 mmol of a dicarboxylic acid derivative obtained by reacting 14.08 g (54.52 mmol) of diphenyl ether-4,4'-dicarboxylic acid and 14.74 g (109.74 mmol) of 1-hydroxy-1,2,3-benzotriazole, 9.62 mmol of a dicarboxylic acid derivative obtained by reacting 3.85 g (9.62 mmol) of isophthalic acid and 2.60 g (19.24 mmol) of 1-hydroxy-1,2,3-benzotriazole, and 141.7 g of N-methyl-2-pyrrolidone. After the addition of 16.45 g (70.82 mmol) of 3,3'-diamino-4,4'-dihydroxybiphenyl ether and 10.0 g of N-methyl-2-pyrrolidone, the mixture was reacted at 75° C. for 12 hours. After the addition of 2.9 g (16.84 mmol) of 4-ethynylphthalic anhydride dissolved in 5.8 g of N-methyl-2-pyrrolidone, the mixture was stirred at 75° C. for 12 hours to complete the reaction. After filtering the reaction mixture, the reaction mixture was poured into a 3:1 (volume ratio) water/methanol mixture, and the precipitate was collected by filtration. The precipitate was then sufficiently washed with water, and dried under vacuum to obtain a polyamide resin (A-4). The polyamide resin (A-4) had a value "[a/(a+b)]×100" of 47, and a weight average molecular weight (Mw) of 31,100.

<Preparation and Evaluation of Positive-Type Photosensitive Resin Composition>

A positive-type photosensitive resin composition was prepared and evaluated in the same manner as in Example 1, except that the polyamide resin (A-4) was used instead of the polyamide resin (A-1).

Comparative Example 1

Preparation of Novolac Resin

A four-necked separable flask equipped with a thermometer, a stirrer, a raw material inlet, and a dry nitrogen gas feed pipe was charged with 86.5 g (800 mmol) of m-cresol, 55.1 (formaldehyde: 850 mmol) of a 37 wt % formaldehyde aqueous solution, 5.0 g (40 mmol) of oxalic acid dihydrate, 52.6 g of purified water, and 182 g of dioxane. The mixture was reacted at 100° C. for 12 hours using an oil bath. After cooling the reaction mixture to room temperature, the reaction mixture was removed into a separating funnel. The reaction mixture was separated into two layers in the separating funnel, and only the lower layer was collected. The solution was concentrated, dehydrated, and dried to obtain an alkali-developable novolac resin (R-1).

<Preparation and Evaluation of Positive-Type Photosensitive Resin Composition>

A positive-type photosensitive resin composition was prepared and evaluated in the same manner as in Example 1, except that the novolac resin (R-1) was used instead of the polyamide resin (A-1).

Comparative Example 2

Preparation of Norbornene Resin

All glass instruments were dried at 60° C. overnight under reduced pressure. The glass instruments were then placed in a glove box in which the oxygen concentration and the humidity were 1% or less. A 500 ml vial bottle was charged with toluene (140 ml), hydroxyhexafluoroisopropylnorbornene (39.82 g, 0.145 mol), trimethylsilyl 5-norbornene-2-carboxylate (3.28 g, 0.0156 mol), dimethylanilinium tetrakis(pentafluorophenyl)borate (0.47 g, 0.593 mmol), triethylsilane (0.6 g, 5.2 mmol), and decane (10 g) together with a stirring rod, and closed to prepare a reaction solution. A 30 ml vial bottle was charged with trimethylsilyl 5-norbornene-2-carboxylate (6.9 g, 0.033 mol) and anhydrous toluene (10.8 g). The mixture was introduced into a syringe to prepare a monomer feed solution. A 10 ml vial bottle was charged with bis[(dicyclohexyl-tert-butylphosphine)palladium(acetonitrile)acetate]tetrakis(pentafluorophenyl)borate (0.27 g, 0.94 mmol) and dichloromethane (4 ml), and closed to prepare a catalyst solution.

After heating the reaction solution with stirring in an oil bath at 80° C., the catalyst solution was injected into the reaction solution. The monomer feed solution was added over 12 hours according to a given program. After the addition, the mixture was reacted for eight hours. Then, a solution prepared by dissolving bis(2-diphenylphosphinoethyl)phenylphosphine (0.44 g) in 10 ml of THF was added to terminate the reaction. The 500 ml vial bottle was removed from the oil bath, and cooled to room temperature. The 500 ml vial bottle was then opened. After the addition of THF (100 ml), glacial acetic acid (28 ml), hydrogen peroxide (56 ml, 30 wt % aqueous solution), and deionised water (84 ml) to the reaction solution, the mixture was vigorously stirred for 18 hours. The reaction solution was separated into an aqueous layer and an organic layer. After removing the aqueous layer, the organic layer was washed twice with deionised water (100 ml), and concentrated using a rotary evaporator. The concentrate was added dropwise to hexane (800 ml) to precipitate the polymer, which was collected by filtration. The polymer was then dried under vacuum to obtain 24 g (yield: 53.7%) of a white powdery addition copolymer (R-2) of 1,1-bistrifluoromethyl-2-(bicyclo[2.2.1]hept-2-en-5-yl)ethyl alcohol and 5-norbornene-2-carboxylic acid (=70:30). The Mw and the Mn of the addition polymer (R-2) determined by GPC were 13,460 and 8280, respectively. The polymer composition was determined by $^1$H-NMR. The content of 1,1-bistrifluoromethyl-2-

(bicyclo[2.2.1]hept-2-en-5-yl)ethyl alcohol was 71 mol %, and the content of 5-norbornene-2-carboxylic acid was 29 mol %.

<Preparation of Positive-Type Photosensitive Resin Composition>

10 g of the addition polymer (R-2), 15 g of propylene glycol monoethyl ether, 2.5 g of a bisphenol A epoxy resin ("LX-01" manufactured by Daiso Co., Ltd.), 0.5 g of an oxetane group-containing compound ("OXT-121" manufactured by Toagosei Co., Ltd.), and 1.5 g of 1,2-naphthoquinone-2-diazido-5-sulfonate of 4,4'-[(3-hydroxyphenyl)methylenebis(2-cyclohexyl-5-methylphenol) were mixed to prepare a homogenous positive-type photosensitive resin composition.

<Evaluation of Positive-Type Photosensitive Resin Composition>

The positive-type photosensitive resin composition was evaluated in the same manner as in Example 1, except that the positive-type photosensitive resin composition thus obtained was used.

The evaluation results of the examples and comparative examples are shown in Table 1.

TABLE 1

| Evaluation item | Example 1 | Example 2 | Example 3 | Example 4 | Comparative Example 1 | Comparative Example 2 |
|---|---|---|---|---|---|---|
| Weight average molecular weight | 11,800 | 13,600 | 25,200 | 31,100 | 3,300 | 13,460 |
| Cyclization rate |  |  |  |  |  |  |
| Cyclization rate [A] (250° C.) (%) | 80 | 97 | 32 | 47 | — | — |
| Cyclization rate [B] (300° C.) (%) | 100 | 100 | 100 | 100 | — | — |
| Cyclization rate ratio [A]/[B] | 0.80 | 0.97 | 0.32 | 0.47 | — | — |
| Tensile modulus of elasticity (GPa) | 3.0 | 2.2 | 3.8 | 3.0 | 1.6 | 2.8 |
| Tensile elongation (%) | 40 | 13 | 53 | 89 | 7 | 3 |
| Glass transition temperature (Tg) | 260 | 233 | 398 | 234 | 210 | 317 |
| Thickness change rate (%) | +0.5 | +0.9 | +0.1 | +0.5 | +1.3 | −1.7 |
| Semiconductor device trial production results | No problem | No problem | No problem | No problem | Note 1 | Note 2 |

Note 1: Cracks occurred in the cured film when removing the resist using acetone.
Note 2: Wrinkles occurred in the cured film after depositing the Ti/Al/Ti wiring layer.

The cured films obtained in Examples 1 to 4 had a tensile modulus of elasticity and a tensile elongation within the range of the present invention, and did not cause problems in the semiconductor device trial production. On the other hand, the cured films obtained in Comparative Examples 1 and 2 had a tensile modulus of elasticity and/or a tensile elongation outside the range of the present invention, and caused problems in the semiconductor device trial production.

EXPLANATION OF SYMBOLS

| | |
|---|---|
| 1 | Silicon wafer |
| 2 | Aluminum pad |
| 3 | Passivation film |
| 4 | Protective film |
| 5 | Metal (e.g., Cr or Ti) film |
| 6 | Wire (e.g., Al or Cu) |
| 7 | Insulating film |
| 8 | Barrier metal |
| 9 | Resist |
| 10 | Solder |
| 11 | Flux |
| 12 | Solder bump |

INDUSTRIAL APPLICABILITY

According to the present invention, a highly reliable positive-type photosensitive resin composition that exhibits excellent properties even when heated at a low temperature can be provided. The positive-type photosensitive resin composition may be suitably used to form a passivation film or an interlayer dielectric of a semiconductor element, an insulating film of a display device, and the like.

The invention claimed is:

1. A positive-type photosensitive resin composition comprising (A) a polyamide resin that includes a structural unit shown by the following formula (1) and a structural unit shown by the following formula (2), and (B) a photosensitive compound, the polyamide resin (A) having a weight average molecular weight (Mw) of 5000 to 80,000, and a cured film obtained by curing the positive-type photosensitive resin composition at 250° C. having a tensile modulus of elasticity of 2.0 to 4.0 GPa and a tensile elongation of 10 to 100%,

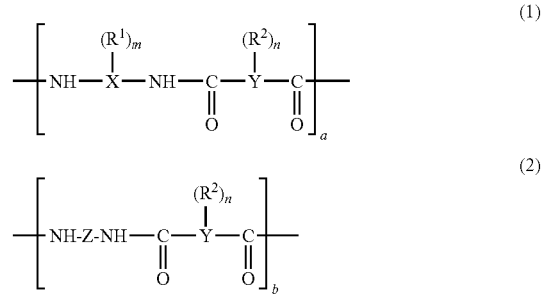

wherein X and Y represent organic groups, $R^1$ represents a hydroxyl group, $-O-R^3$, or an organic group having 1 to 5 carbon atoms ($R^1$ may be the same or different when m is two or more), $R^2$ represents a hydroxyl group, a carboxyl group, $-O-R^3$, or $-COO-R^3$ ($R^2$ may be the same or different when n is two or more), $R^3$ represents an organic group having 1 to 15 carbon atoms, provided that at least one $R^2$ is a carboxyl group when $R^1$ is not a hydroxyl group, and at least one $R^1$ is a hydroxyl group when $R^2$ is not a carboxyl group, m represents an integer from 0 to 4, n represents an integer from 0 to 4, Z represents $-R^4-Si(R^6)(R^7)-O-Si(R^6)(R^7)-R^5-$ (wherein $R^4$ to $R^7$ represent organic groups), a represents an integer equal to or larger than one, and b represents an integer equal to or larger than zero, provided that [a/(a+b)]×100=30 to 100.

2. The positive-type photosensitive resin composition according to claim 1, wherein a cyclization rate ratio ([A]/[B]) of the cyclization rate ([A]%) of a cured film obtained by curing the positive-type photosensitive resin composition at 250° C. to the cyclization rate ([B]%) of a cured film obtained by curing the positive-type photosensitive resin composition at 300° C. is 0.30 or more, and a cured film obtained by curing the positive-type photosensitive resin composition at 250° C. has a glass transition temperature (Tg) of 230 to 400° C.

3. The positive-type photosensitive resin composition according to claim 1, wherein the photosensitive compound (b) is a diazoquinone compound.

4. The positive-type photosensitive resin composition according to claim 1, the positive-type photosensitive resin composition being used to form an insulating film or a protective film of a semiconductor device.

5. The positive-type photosensitive resin composition according to claim 1, wherein a thickness change rate shown by the following expression (1) is within ±1%.

Thickness change rate (%)=[(thickness after immersion/thickness before immersion)×100]−100 (1)

when immersing a cured film obtained by curing the positive-type photosensitive resin composition at 250° C. in a flux cleaning agent at 50° C. for 10 minutes.

6. A cured film obtained by curing the positive-type photosensitive resin composition according to claim 1.

7. A protective film comprising the cured film according to claim 6.

8. An insulating film comprising the cured film according to claim 6.

9. A semiconductor device comprising the cured film according to claim 6.

* * * * *